United States Patent
Rossi et al.

(10) Patent No.: US 9,613,939 B2
(45) Date of Patent: Apr. 4, 2017

(54) OPTO-ELECTRONIC MODULES INCLUDING FEATURES TO HELP REDUCE STRAY LIGHT AND/OR OPTICAL CROSS-TALK

(71) Applicant: Heptagon Micro Optics Pte. Ltd., Singapore (SG)

(72) Inventors: Markus Rossi, Jona (CH); Jens Geiger, Thalwil (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 14/760,059

(22) PCT Filed: Jan. 2, 2014

(86) PCT No.: PCT/SG2014/000001
§ 371 (c)(1),
(2) Date: Jul. 9, 2015

(87) PCT Pub. No.: WO2014/109711
PCT Pub. Date: Jul. 17, 2014

(65) Prior Publication Data
US 2015/0340351 A1     Nov. 26, 2015

Related U.S. Application Data (60) Provisional application No. 61/751,018, filed on Jan. 10, 2013.

(51) Int. Cl.
H01L 25/16 (2006.01)
H01L 33/58 (2010.01)
H01L 31/0232 (2014.01)

(52) U.S. Cl.
CPC .......... *H01L 25/167* (2013.01); *H01L 25/165* (2013.01); *H01L 31/02325* (2013.01); *H01L 33/58* (2013.01); *H01L 2924/0002* (2013.01)

(58) Field of Classification Search
None
See application file for complete search history.

(56) References Cited

U.S. PATENT DOCUMENTS

| 8,791,489 B2 | 7/2014 | Rudmann et al. |
| 2011/0032409 A1 | 2/2011 | Rossi et al. |
| 2013/0019461 A1* | 1/2013 | Rudmann ............. H01L 25/167 29/592.1 |

FOREIGN PATENT DOCUMENTS

| CN | 102820269 A | 12/2012 |
| TW | 201138082 A | 11/2011 |

(Continued)

OTHER PUBLICATIONS

International Search Report and Written Opinion for PCT/SG2014/000001 issued by ISA/AU on Mar. 18, 2014.
(Continued)

*Primary Examiner* — Michelle Mandala
(74) *Attorney, Agent, or Firm* — Fish & Richardson P.C.

(57) ABSTRACT

Opto-electronic modules, which can be fabricated in a wafer-scale process, include light emitting and/or light sensing devices mounted on or in a substrate. The modules, which can include various features to help reduce the occurrence of optical cross-talk and help prevent interference from stray light, can be used in a wide range of applications, including medical and health-related applications. For example, performing a measurement on a human body can include bringing a portion of the human body into direct contact with an exterior surface of the opto-electronic module and using a differential optical absorption spectroscopy technique to obtain an indication of a physical condition of the human body.

17 Claims, 9 Drawing Sheets

(56) References Cited

FOREIGN PATENT DOCUMENTS

| | | |
|---|---|---|
| TW | 201218350 A | 5/2012 |
| WO | 2009/076788 | 6/2009 |
| WO | 2011/156928 | 12/2011 |

OTHER PUBLICATIONS

Intellectual Property Office of Taiwan, Search Report for Taiwanese Patent Application No. 103100228 (Feb. 18, 2017) (with English translation).

* cited by examiner

OPTO-ELECTRONIC MODULES INCLUDING FEATURES TO HELP REDUCE STRAY LIGHT AND/OR OPTICAL CROSS-TALK

TECHNICAL FIELD

This disclosure relates to opto-electronic modules such as sensor modules and, in particular, to the packaging and manufacturing of miniaturized sensor modules.

BACKGROUND

Various types of sensors are used widely in physics, chemistry, and engineering and find use in a wide range of applications, including consumer electronics and medical devices, among others. Some of these sensors use optical signals to sense or measure parameters of interest, e.g., pressure, distance, temperature or composition.

In many applications, it is desirable to provide particularly small sensors. Furthermore, there is generally a demand for particularly precise and sensitive sensors. In designing small optical sensors, for example, issues of electrical interference, optical crosstalk, and signal-to-noise ratio often need to be addressed. There are various potential sources of optical interference in some optical sensors: external (e.g., sunlight, indoor lighting, unintended targets) and internal (e.g., optical crosstalk between the subcomponents of the optical sensor). External interference sometimes can be suppressed or reduced as part of signal processing. Internal interference, on the other hand, can be more challenging to manage, particularly in applications where the sensor is mounted behind a transparent or semi-transparent cover such that the intensity of the light reflected from the cover may be similar in magnitude to the signal of interest.

SUMMARY

Opto-electronic modules are disclosed that, in some implementations, can help reduce stray light, optical interference and/or crosstalk, and can improve signal-to-noise ratio.

Examples of the modules are described in greater detail below, and various aspects of the invention are set forth in the accompanying claims. In general, the modules, which can be fabricated in a wafer-scale process, include opto-electronic devices (e.g., light emitting and/or light sensing devices) mounted on or in a substrate. The modules include various features that can help reduce the occurrence of optical cross-talk and help prevent interference from stray light. Methods of fabricating the modules are described as well.

The modules can be used in a wide range of applications, including medical and health-related applications. For example, a method of performing a measurement on a human body can include bringing a portion of the human body into direct contact with an exterior surface of the opto-electronic module, providing light emitted from the module at a first wavelength to the portion of the human body while the portion of the human body is in contact with the upper exterior surface of the module, and detecting, by the module, light reflected by the portion of the human body into the module while the portion of the human body is in contact with the upper exterior surface of the module. Information based on the light detected by the module is processed to provide an indication of a physical condition of the human body.

In some implementations, processing the information can include using a differential optical absorption spectroscopy technique. Light emitted from the module can be provided at one or more off-line wavelengths that exhibit low scattering or absorption and one or more on-line wavelengths that exhibit strong scattering or absorption. The method can include illuminating the portion of the human body using light emitted from the module and measuring changes in light absorption.

The modules can be used for other types of applications as well.

The details of one or more implementations are set forth in the accompanying drawings and the description below. Other aspects, features, and advantages will be apparent from the description and drawings, and from the claims.

DETAILED DESCRIPTION

Figure 1:
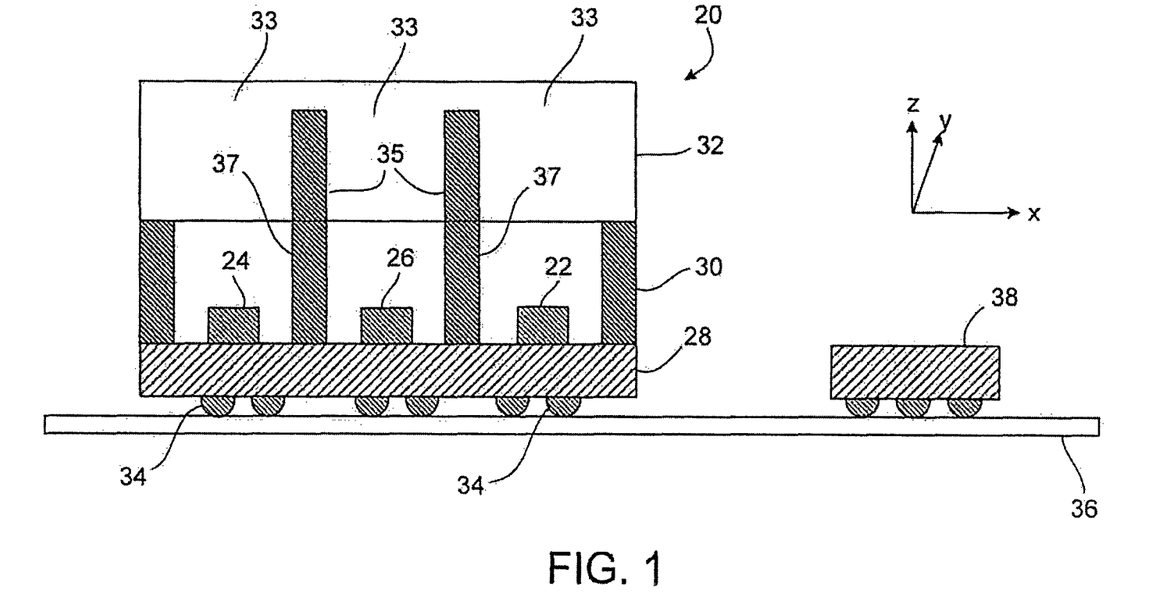
FIG. 1 is a cross-sectional view of an example of an opto-electronic module.

As illustrated in FIG. 1, an opto-electronic module 20 houses multiple active optical components, including a first light emitting element 22, a second light emitting element 24 and a light sensing element 26. Examples of light emitting elements 22, 24 include LEDs, OLEDs and laser chips. Examples of light sensing element 26 include photodiodes and image sensors. Light sensing element 26 can be arranged to sense light at wavelengths or in a range of wavelengths emitted by first and second light emitting elements 22, 24. Light emitting elements 22, 24 may emit light at the same wavelength or at different wavelengths. For example, in some implementations, first light emitting element 22 emits light in the red part of the spectrum (e.g., about 600 nm), whereas second light emitting element 24 emits light in the infra-red (IR) or near-IR part of the spectrum (e.g., in the range of about 700-1100 nm). Different wavelengths or ranges of wavelengths may be used in other implementations.

Module 20 includes several constituents stacked upon each other in the vertical direction. In the example of FIG. 1, module 20 includes a substrate 28, a separation member 30, and a substantially transparent cover glass 32. Substrate 28 can be, for example, a printed circuit board assembly (PCB). On substrate 28 are mounted light emitting elements 22, 24 and light sensing element 26, whose optical axes are separated from another by vertical walls of separation member 30. Thus, separation member 30 laterally encircles each of light emitting elements 22, 24 and light sensing element 26.

Electrical contacts of light emitting elements 22, 24 and light sensing element 26 are connected electrically to outside module 20, where solder balls 34 are attached. Some implementations include multiple (e.g., two) electrical contacts for each of the light emitting and sensing elements. Instead of solder balls 34, some implementations include contact pads on substrate 28, which may be provided with solder balls at a later time.

Module 20 can be mounted on a printed circuit board 36, e.g., using surface mount technology (SMT), next to other electronic components. Printed circuit board 36 may be a component of an electronic device such as a biometric or other opto-electronic sensor. Module 20 is particularly suitable for such applications because it can be manufactured to have a particularly small size and is mass-producible using wafer-level manufacturing techniques. An integrated circuit 38 such as a control unit or controller chip, which is operationally interconnected with module 20 by printed circuit board 36, also can be mounted to printed circuit board 36. Integrated circuit 38 can evaluate signals from module 20 and/or provide control signals to module 20.

Separation member 30 may fulfill several tasks in some implementations. It can help ensure a well-defined distance between substrate 28 and cover glass 32 (through its vertical extension) so as to achieve well-defined light paths from light emitting elements 22, 24 through cover glass 32 and from the outside of module 20 through cover glass 32 to light sensing element 26. Separation member 30 also can help provide protection of light sensing element 26 from light external to module 20 that is not supposed to be detected. Separation member 30 also can help provide protection of light sensing element 26 from light emitted by light emitting elements 22, 24 that should not reach the light sensing element, so as to reduce optical cross-talk. In addition, light reflected inside module 20 and stray light originating from light emitting elements 22, 24 can be prevented from reaching light sensing element 26. Such protection can be achieved, for example, by forming separation member 30 of a material that is substantially non-transparent to light generally detectable by light sensing element 26. If module 20 contains more than one light emitting element, the light emitting elements can be placed in separated cavities or can be placed in a common cavity. Likewise, in some implementations, a common light shaping element (e.g. lens) is provided for multiple light emitting elements.

Cover 32 is composed primarily of first regions 33 that are transparent to light emitted by light emitting elements 22, 24 and to light that is to be detected by light sensing element 26. Cover 32 also includes second light blocking regions 35 embedded within transparent regions 33. Second regions 35 are located above, and generally aligned with, the internal vertical walls 37 of separation member 30, and are composed of a material that is substantially non-transparent to light emitted by light emitting elements 22, 24 and to light that is to be detected by light sensing element 26. Regions 35 can help reduce optical cross-talk and detection by light sensing element 26 of other undesirable light signals.

Non-transparent second regions 35 extend at least partially through cover 32 in the vertical direction (i.e., in the z-direction) so as to help reduce optical cross-talk. For example, in the illustrated example, non-transparent second regions 35 extend vertically from the bottom surface of cover 32 (i.e., the surface of cover 32 adjacent the top surface of separation member 30) toward its top surface. Although, it may be desirable in some implementations for non-transparent second regions 35 to extend vertically almost to the top of cover 32, a small amount of transparent material can be allowed to remain for structural stability during subsequent handling and processing. Thus, in the illustrated example, regions 35 do not extend all the way to the top surface of cover 32. Non-transparent second regions 35 also can extend substantially through the entire width of cover 32 (i.e., in the y-direction).

In some implementations, non-transparent regions 35 of cover 32 are composed of a polymer material, e.g., a hardenable (e.g., curable) polymer material, such as an epoxy resin. Regions 35 can be composed, for example, of an epoxy containing carbon black to make them substantially non-transparent to light at the desired wavelengths. For example, in some implementations, regions 35 can be made of a UV- or thermally-curing epoxy containing carbon black or other dark pigment. In some implementations, the carbon black is embedded in the epoxy. The amount of carbon black in the epoxy may depend on the particular application and may depend, for example, on the desired or required optical characteristics of regions 35. Thus, in some implementations, to reduce optical cross-talk or detection of other undesirable light by light sensing element 26, regions 35 can be made of a UV or thermally curing epoxy containing at least 0.7% carbon black, although in some implementations a lower amount of carbon black can be sufficient.

The optimal or desired percentage of carbon black in the epoxy for regions 35 of cover 32 may be adjusted, for example, depending on the lateral thickness of those regions. For example, in some implementations, the lateral thickness is about 200 μm, and the epoxy material contains about at least 0.8% carbon black. For light having a wavelength of 800 nm, the foregoing composition can result in an absorption coefficient ($\alpha$) of about 0.0295/μm. In general, the transmission $T=10^{-\alpha*d}$ for a lateral thickness d. Thus, in the foregoing example, the transmission (T) through the regions 35 would be less than 0.00015%, which corresponds to an absorbance, or optical density, of about 5.8, where the absorbance represents a logarithmic ratio of the amount of radiation falling on a material to the amount of radiation transmitted through the material. In some applications, the amount of carbon black is sufficiently high such that the transmission (T) of light through the lateral thickness at the wavelength of light emitted by light emitting elements, 22, 24 is no greater than 0.1%. Likewise, in some applications, the amount of carbon black is sufficiently high such that the absorbance, or optical density, of regions 35 at the wavelength of light emitted by light emitting elements 22, 24 is at least 3. In some implementations, regions 35 have an absorption coefficient ($\alpha$) of at least 0.015/μm at the wavelength of light emitted by light emitting elements 22, 24 for a lateral thickness of about 200 μm.

Various resin-based epoxy materials can be used as the base material for light blocking regions 35, with the addition of one or more pigments or other adhesives to reduce the optical transmission characteristics at the wavelength(s) of interest. Examples of such base materials include one or more of the following: EMCAST™ (e.g., 23xx, 24xx, 25xx and 2600 series), available from Electronic Materials, Inc.; MASTERBOND™ (e.g., UV15-7DC, UV1ODCTK) available from Master Bond Inc.; DELO-DUALBOND™ (e.g., AD VE 80342) available from DELO Industrial Adhesives; AC A1449, available from Addison Clear Wave; EPOTEK OG198-54, available from Epoxy Technology, Inc.; and LOCTITE 334, 392, 5091. Some of the foregoing materials are dual-curing (i.e., can be cured by UV light as well as thermally).

The materials described above for light blocking regions 35 of cover 32 also can be used for separation member 30. Thus, in some implementations, light blocking regions 35 and separation member 30 are composed of the same material.

In some implementations, transparent regions 33 of cover 32 are selectively transparent. For example, they can be made of, or coated with, materials that are highly transmissive for the light emitted by the light emitting element(s) 22, 24 and, at the same time, they can be reflective or absorptive for some or all other wavelengths, especially for ambient light like sunlight. This can improve the signal-to-noise ratio.

As illustrated in FIG. 1, module 20 is a packaged optoelectronic component. The vertical side walls of module 20 are formed by substrate 28, separation member 30 and cover 32. A bottom wall is formed by substrate 28, and a top wall by cover 32. Each of substrate 28, separation member 30 and cover 32 can have substantially the same lateral shape and lateral dimensions, which can facilitate an efficient way of manufacturing such modules 20.

Opto-electronic components (i.e., light emitting elements 22, 24 and light sensing element 26) can be either packaged or unpackaged electronic components. For contacting substrate 28, technologies such as wire-bonding or flip chip technology or any other known surface mount technologies may be used, as can conventional through-hole technology.

Figure 2:
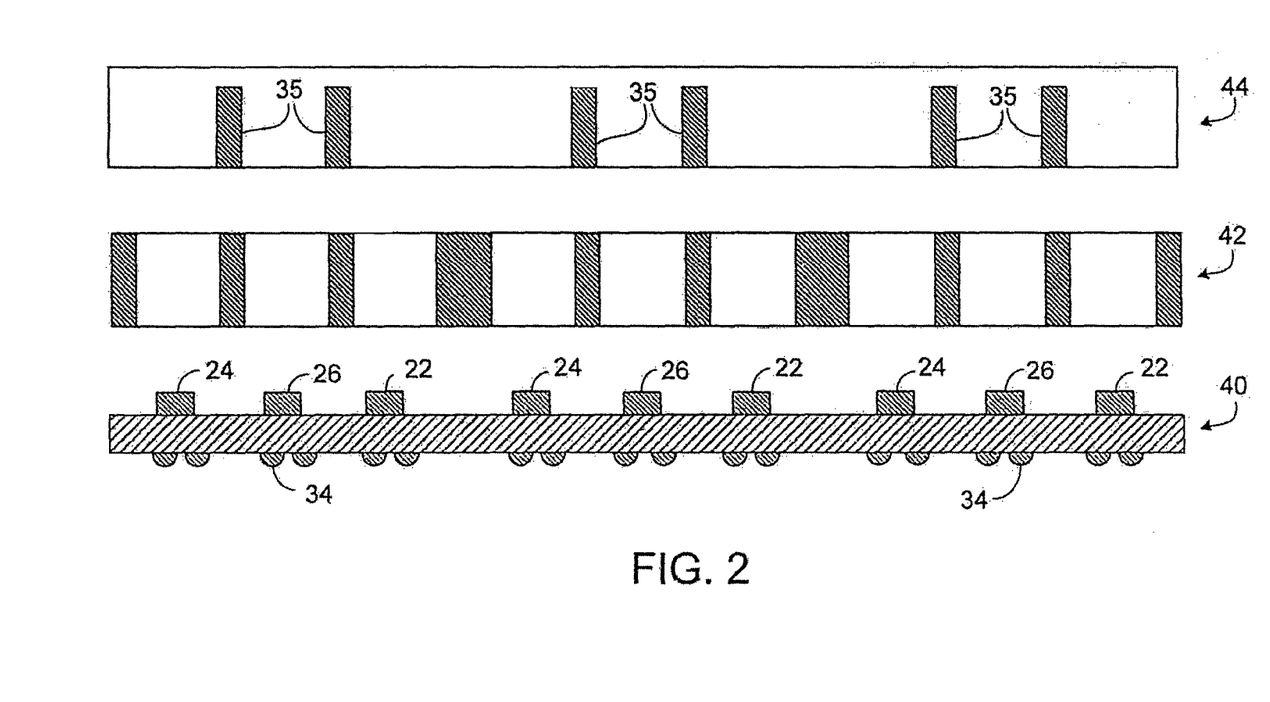
FIG. 2 is a cross-sectional view of wafers for forming a wafer stack for manufacturing multiple modules as shown in of FIG. 1.

FIG. 2 shows a schematic cross-sectional view of wafers for forming a wafer stack for manufacturing multiple modules 20 as shown in FIG. 1. Generally, a wafer refers to a substantially disk- or plate-like shaped item, its extension in one direction (z-direction or vertical direction) is small with respect to its extension in the other two directions (x- and y-directions or lateral directions). On a (non-blank) wafer, a plurality of similar structures or items can be arranged, or provided therein, for example, on a rectangular grid. A wafer can have openings or holes, and in some cases a wafer may be free of material in a predominant portion of its lateral area. Depending on the implementation, a wafer may be made, for example, of a semiconductor material, a polymer material, a composite material comprising metals and polymers or polymers and glass materials. The wafers may comprise hardenable materials such as a thermally or UV-curable polymers. In some implementations, the diameter of a wafer is between 5 cm and 40 cm, and can be, for example between 10 cm and 31 cm. The wafer may be cylindrical with a diameter, for example, of 2, 4, 6, 8 or 12 inches, one inch being about 2.54 cm. The wafer thickness can be, for example, between 0.2 mm and 10 mm, and in some cases, is between 0.4 mm and 6 mm. Different materials and dimensions may be appropriate for other implementations.

In the example of FIG. 2, three wafers are used to create a wafer stack for manufacturing multiple modules 20. Although FIG. 2 only shows provisions for three modules 20, in some implementations there can be, in one wafer stack, provisions for at least ten modules in each lateral direction, and in some cases at least thirty or even fifty or more modules in each lateral direction. As shown in FIG. 2, the stack includes a substrate wafer 40, a spacer wafer 42, and a cover wafer 44. Each wafer comprises a multitude of the corresponding members comprised in the corresponding module 20, arranged for example on a rectangular lattice, with a little distance from each other to facilitate a subsequent separation (e.g., dicing) step.

Substrate wafer 40 can be, for example, a PCB assembly comprising a printed circuit board of standard PCB materials, provided with solder balls 34 on the one side and with opto-electronic components (i.e., light emitting and light sensing elements 22, 24, 26) soldered to the other side. The latter can be placed on substrate wafer 40, for example, by pick-and-place using standard pick-and-place machines.

Figure 3A:
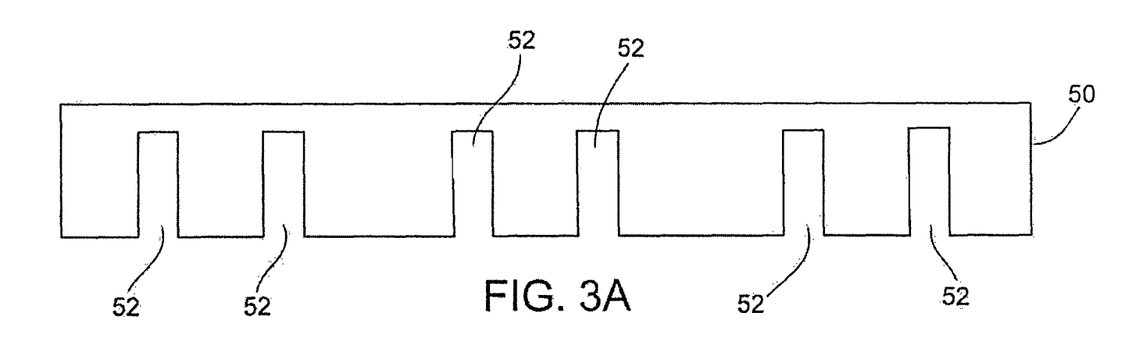
FIGS. 3A and 3B are cross-sectional views illustrating a method of forming covers for the opto-electronic modules.
Figure 3B:
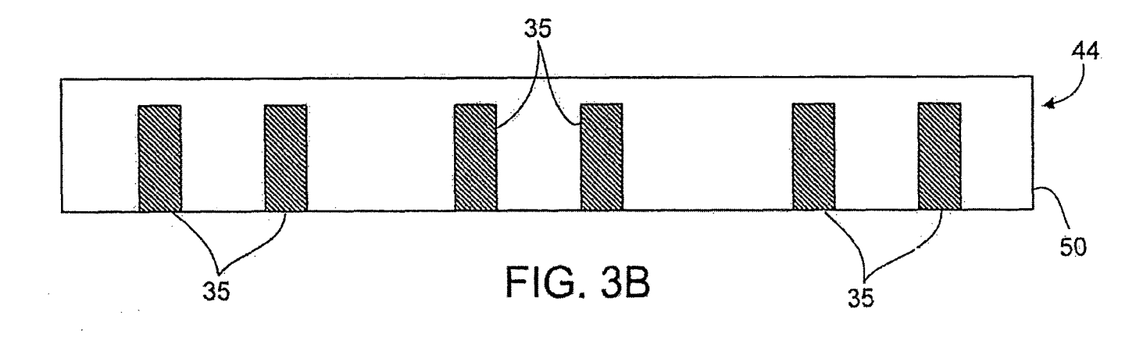

Cover wafer 44 can be formed in various ways. For example, as shown in FIG. 3A, a substantially transparent glass wafer 50 can be structured (e.g., by etching, cutting or milling) to form openings 52 corresponding to the locations for non-transparent (light blocking) regions 35. Openings 52 then are filled at least partially, but preferably substantially completely, with black epoxy or other non-transparent material to form light blocking regions 35, as shown in FIG. 3B.

Wafers 40, 42, 44 then can be attached to one another, for example using an adhesive material, to form the wafer stack. The wafer stack subsequently can be separated (e.g., by dicing) into individual modules 20.

In an alternative wafer-level fabrication technique, separation member 30 is formed of the same material and in the same process step as light blocking regions 35 that are embedded in cover 32. The separation member can be formed, for example, by replication, which refers to a technique in which a given structure (or a negative thereof) is reproduced (e.g., by etching, embossing or molding). In some replication techniques, a liquid, viscous or plastically deformable material fills parts of a replication tool, the material then is hardened, e.g., by curing using ultraviolet radiation or heating, and the replication structure is removed from the replication tool. Thus, a replica (which in this case is a negative replica) of the structured surface is obtained. Suitable materials for replication are, for example, hardenable (e.g., curable) polymer materials or other replication materials, i.e. materials which are transformable in a hardening or solidification step (e.g., a curing step) from a liquid, viscous or plastically deformable state into a solid state.

Figure 4A:
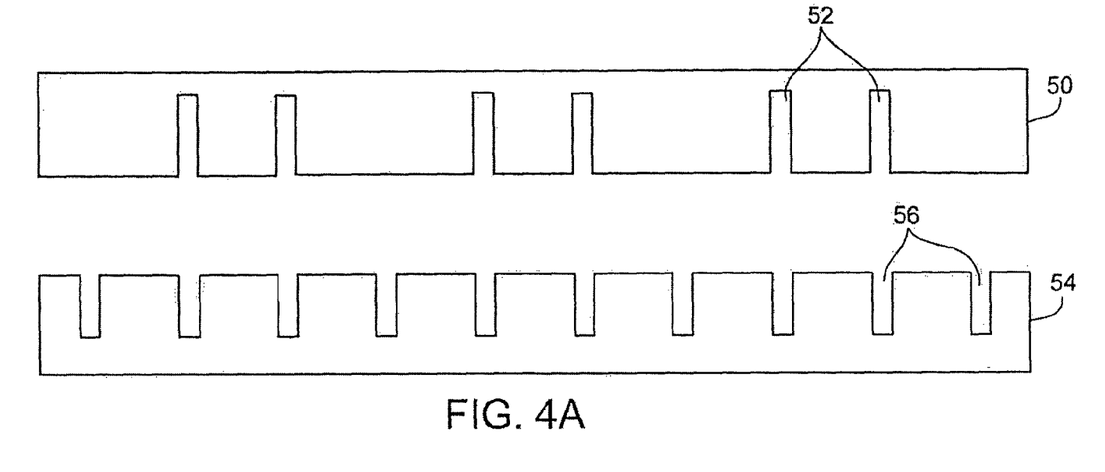
FIGS. 4A through 4D are cross-sectional views illustrating another method of forming covers for the opto-electronic modules.
Figure 4B:
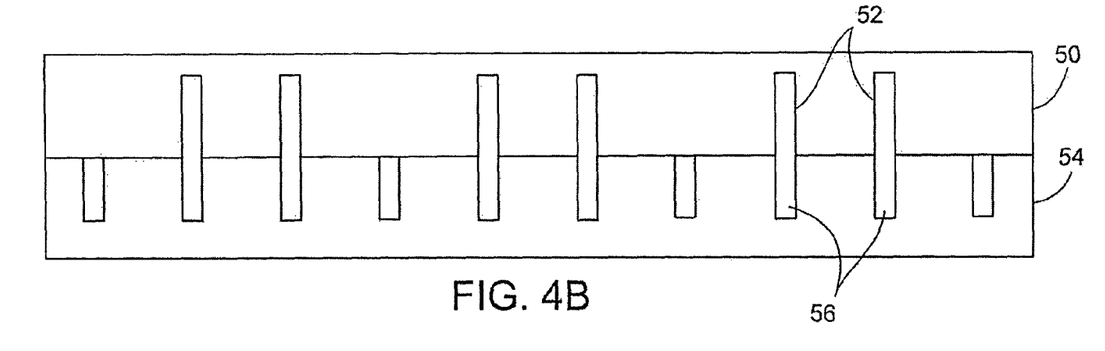
Figure 4C:
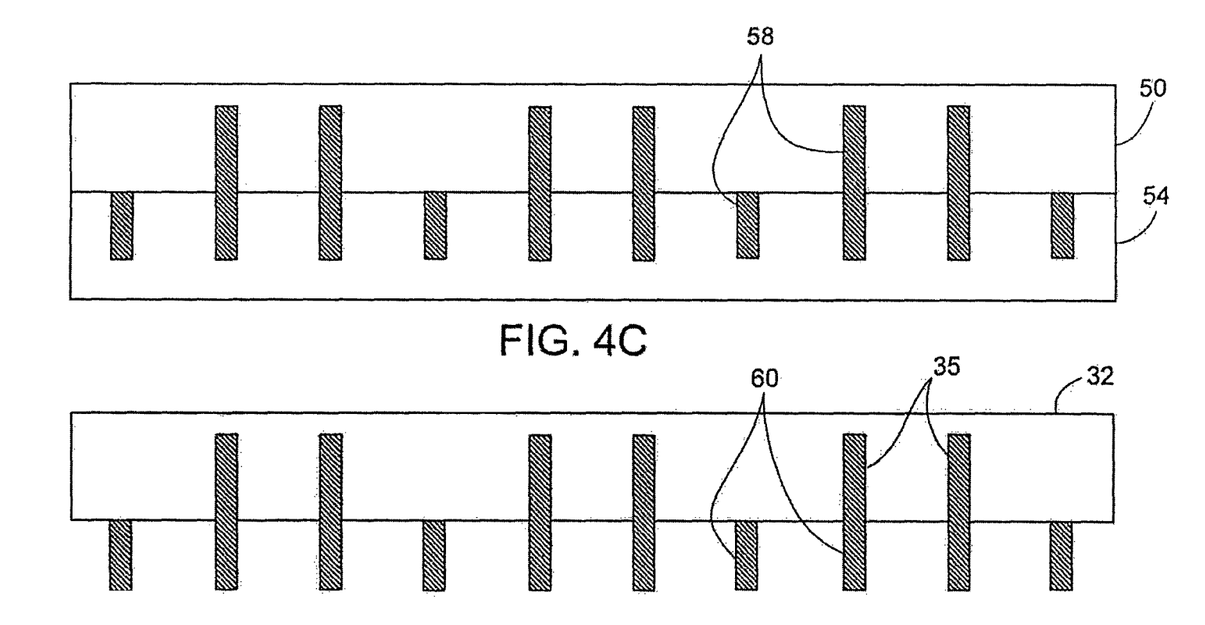
Figure 4D:
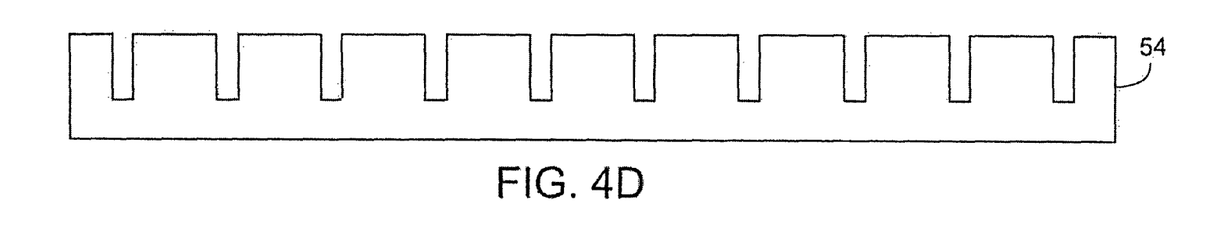

An example of a wafer-level replication process for forming separation members of the same material and in the same process step as embedded light blocking regions 35 is illustrated in FIGS. 4A through 4D. As shown in FIG. 4A, a transparent glass wafer 50 is provided with openings 52 in one of its surfaces. Openings 52 correspond to the locations for the light blocking regions 35. A replication tool 54 is provided and includes vertical openings 56 in one of its surfaces. Openings 56 correspond to the locations for the separation members. As shown in FIG. 4B, transparent glass wafer 50 and replication tool 54 are brought into contact with one another. Some openings 56 in replication tool 54 are aligned with openings 52 in glass wafer 50, whereas other openings 56 in replication tool 54 are not aligned with any of the openings 52 in glass wafer 50. Next, as shown in FIG. 4C, openings 52 and 56 are filled substantially with a replication material 58, which then is hardened (e.g., cured). The material for replication material 58 can be chosen, for example, so that, when hardened, it is substantially non-transparent to wavelengths of light that are emitted by light emitting elements 22, 24 or sensed by light sensing element 26. An example of the replication is an epoxy such as carbon black. Next, replication tool 54 is separated from transparent cover glass 50, which includes embedded light blocking regions 35 formed of replication material 58. Portions 60 of the hardened replication material that extend beyond the surface of cover glass 32 correspond to separation members (e.g., separation member 30 in FIG. 1). Separation member portions 60 that extend from the surface of cover 32 can be attached to substrate wafer (including opto-electronic devices, mounted in or on the substrate) to form a wafer stack that includes cover wafer 32 with embedded light blocking regions 35. The wafer stack can be separated (e.g., diced) to form individual modules 20, as shown in FIG. 1.

In another alternative implementation, a replication technique can be used to form the separation members directly on a substrate wafer on which or in which opto-electronic devices are mounted. Then, a cover wafer, which includes embedded light blocking regions, is attached to the separation members to form a wafer stack. The replicated separation members can be composed of a light blocking material as described above. Adjacent ones of the opto-electronic devices are separated from one another by respective partitions that are part of the separation member. The wafer stack can be separated (e.g., diced) to form individual, modules 20, as shown in FIG. 1.

Figure 5:
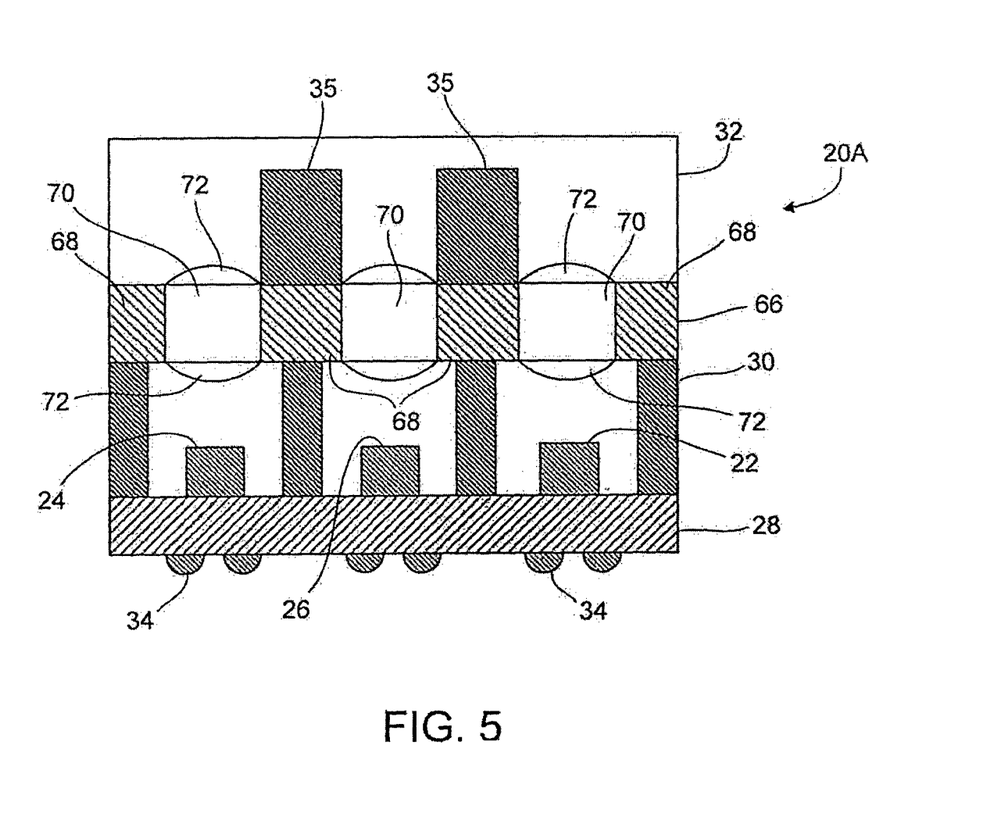
FIG. 5 is a cross-sectional view of another example of an opto-electronic module.

Although the illustrated module 20 of FIG. 1 does not include passive optical components, other implementations can include passive optical components. For example, FIG. 5 illustrates another example of a module 20A, which is similar to module 20 of FIG. 1, but also includes passive optical components. The passive optical components can redirect light by refraction and/or diffraction and/or reflection and can include, for example, a lens, a prism, a mirror or an optical system (e.g., a collection of passive optical components that may include mechanical elements such as aperture stops, image screens or holders). In some implementations, the lenses can further improve crosstalk reduction (e.g., by directing stray light away from the photodiode) and/or can select the sensing depth/area in the object being measured.

As illustrated in FIG. 5, module 20A includes an optics member 66 that has light blocking portions 68, and transparent portions 70 for allowing light emitted by light emitting elements 22, 24 to leave module 20A and for allowing light to enter from outside module 20A and reach light sensing element 26. Light blocking portions 68 are substantially non-transparent for light generally detectable by light sensing element 26, e.g., by being made of a suitable (polymer) material. Passive optical elements such as lenses 72 for light guidance or light shaping can be provided on one or both surfaces of each transparent portion 70.

Multiple modules 20A can be fabricated at the same time in a wafer-level process. After attaching the wafers (i.e., substrate wafer, separation wafer, optics wafer and cover glass wafer) together to form a wafer stack, the wafer stack is separated (e.g., by dicing) to form the individual modules 20A.

Figure 6:
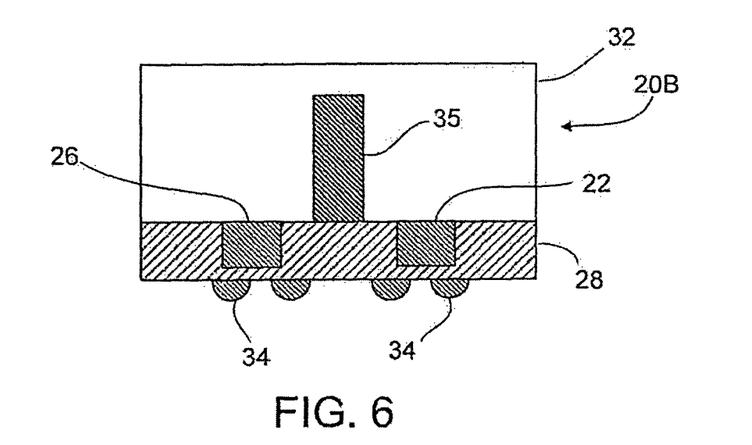
FIG. 6 is a cross-sectional view of yet another example of an opto-electronic module.

Some implementations include neither a separation member 30 and nor passive optical elements such as lenses 72. Instead, as shown in the example module 20B of FIG. 6, cover glass 32 can be attached directly to substrate 28, which carries the active optical components (e.g., light emitting element 22 and light sensing element 26). Cover 32, which is substantially transparent, includes an embedded substantially non-transparent region 35 as described above. Non-transparent region 35, which is embedded in an area of cover 32 so as to reduce stray light and/or optical cross-talk between components 22 and 26, can be formed as discussed above.

Modules 20, 20A and 20B are examples of opto-electronic modules that include a substantially transparent cover that allows light to exit and/or enter the module and that includes one or more embedded non-transparent regions to help reduce stray light and/or optical cross-talk. The details of other modules that include such a cover may differ. For example, some modules may include a different number of light emitting or light sensing elements (e.g., a single light emitting element and a single light sensing element; or multiple light emitting elements and multiple light sensing elements).

Figure 7:
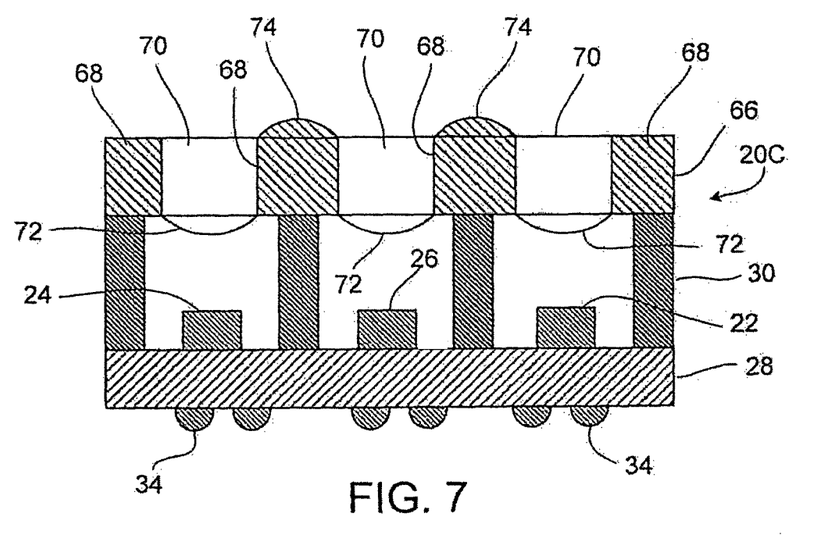
FIG. 7 is a cross-sectional view of a further example of an opto-electronic module.

Some implementations of opto-electronic modules may not include cover glass 32. However, to help reduce stray light and/or optical cross-talk between the active optical components, light blocking elements can be embossed on the top surface of the module. As shown, for example, in FIG. 7, a module 20C includes substrate 28, separation member 30 and optics member 66. Embossed light-blocking elements 74 are provided on light blocking portions 68 of optics member 66. In this example, light blocking elements 74, which may be convex-shaped, project or extend slightly beyond the upper surface of optics member 66. Light-blocking elements 74 can be composed, for example, of the same material as light blocking elements 68 of the optics members.

Figure 8:
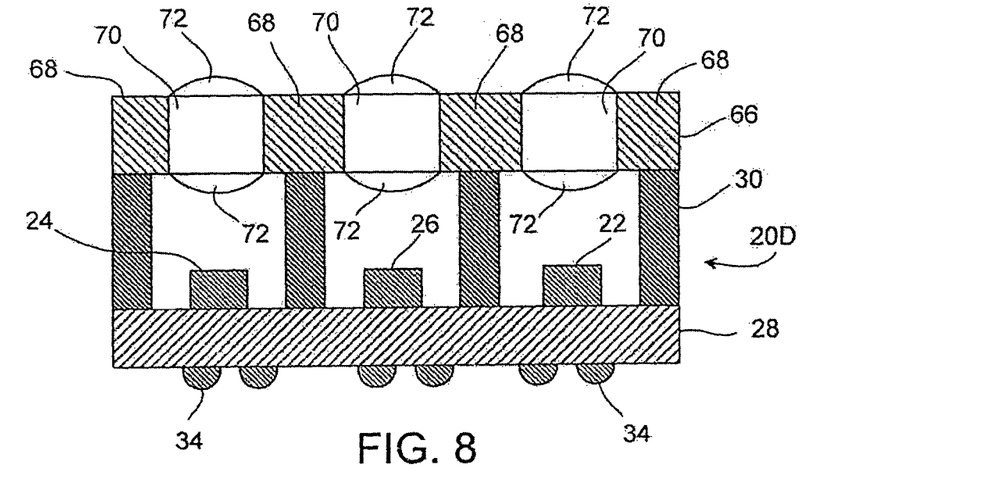
FIG. 8 is a cross-sectional view of another example of an opto-electronic module.

FIG. 8 illustrates another example of a module 20D that does not include cover glass 32. Module 20D includes substrate 28, separation member 30 and optics member 66. Light shaping elements (e.g., lenses) 72 are provided on the upper and lower surfaces of transparent regions 70 of optics member 66, and are aligned, respectively, with the active optical components 22, 24, 26. In this example, light shaping elements 72, which may be convex-shaped, project or extend slightly beyond the upper surface of optics member 66.

Figure 9:
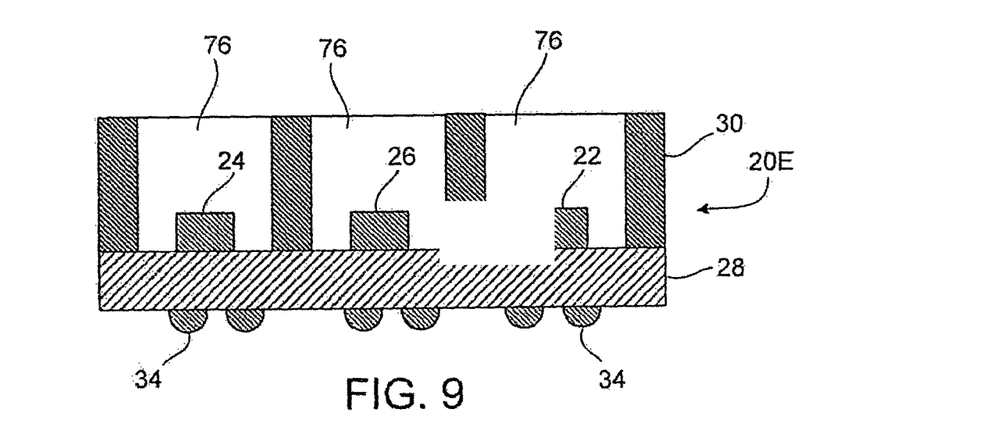
FIG. 9 is a cross-sectional view of yet another example of an opto-electronic module.

Some implementations of the opto-electronic modules do not include cover glass 32 or optics member 66. In that case, as shown in FIG. 9, the upper surface of separation member 30 can serve as the upper surface of the module 20E. As described above, the vertical sidewalls of separation member 30 can help reduce stray light and optical cross-talk between active optical components 22, 24, 26. In addition, to protect active optical components 22, 24, 26, the cavities 76 containing the active optical components can be filled (or substantially filled) with a solid transparent material (i.e., a material that is substantially transparent to the wavelengths of light emitted by or sensed by active optical components 22, 24, 26).

Multiple modules 20C, 20D or 20E can be fabricated at the same time in a wafer-level process. After attaching the wafers together to form a wafer stack, the wafer stack is separated (e.g., by dicing) to form the individual modules.

The modules described above can be used in a wide range of applications, especially applications that are based on differential optical absorption spectroscopy (DOAS). In such applications, spectroscopy is performed in a reflective manner, using one or more off-line wavelengths that exhibit low scattering or absorption and one or more on-line wavelengths that exhibit strong scattering or absorption. The spectroscopy can be performed using the differential signal between the off-line and the on-line wavelengths. The modules described above can be especially useful in measurements for medical applications that employ the DOAS principle.

Figure 10:
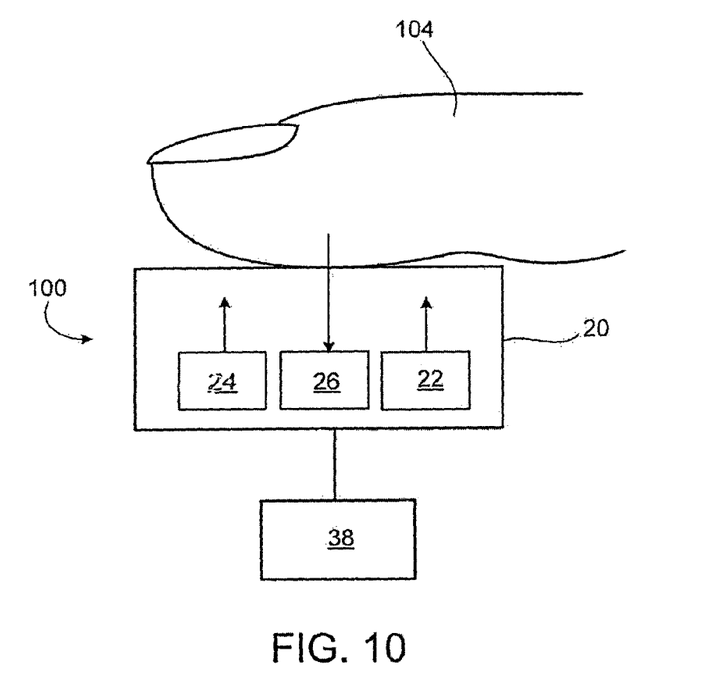
FIG. 10 illustrates an example of a biometric sensor incorporating an opto-electronic module.

FIG. 10 illustrates an example of an optical sensor, in this case a photo-plethysmogram (PPG) sensor 100, which is a type of biometric sensor that uses DOAS techniques. Sensor 100 includes an opto-electronic module as described above (e.g., module 20, 20A, 20B, 20C, 20D or 20E). A PPG can be obtained by using a pulse oximeter, which illuminates the skin and measures changes in light absorption. A conventional pulse oximeter monitors the perfusion of blood to the dermis and subcutaneous tissue of the skin. With each cardiac cycle the heart pumps blood to the periphery. Even though this pressure pulse is somewhat damped by the time it reaches the skin, it is enough to distend the arteries and arterioles in the subcutaneous tissue. If the pulse oximeter is attached without compressing the skin, a pressure pulse can also be seen from the venous plexus, as a small secondary peak. The change in volume caused by the pressure pulse is detected by illuminating the skin with the light from a light-emitting diode (LED) and then measuring the amount of light either transmitted or reflected to a photodiode. Each cardiac cycle appears as a peak. Because blood flow to the skin can be modulated by other physiological systems, the PPG also can be used to monitor breathing, hypovolemia, and other circulatory conditions.

As shown in FIG. 10, PPG sensor 100 includes light emitting portions 22, 24, a light receiving portion 26 to detect light emitted from the light emitting portions after the light penetrates and is reflected by part of a human body (e.g., an index finger) 104. In some implementations of a blood oxygen sensor, light emitting portions 22, 24 emit red (e.g., 660 nm) and IR light (e.g., 850 nm-950 nm), respectively. Using additional wavelengths can improve the signal quality (e.g., higher resolution, higher sensitivity) or enable the measurement of different properties. Sensor 100 also includes a processing unit 38 to acquire information about the plethysmogram based on a measured value provided from the light receiving portion 26.

The PPG sensor provides a non-invasive method based on the measurement of the intensity of an infrared-light or other light beam, which penetrates the index finger 104. For example, light can be emitted from the light emitting portions (e.g., a LED) to the fingertip pressed to the upper surface of the module. The intensity of light that penetrates and is reflected by the living tissue is detected at light receiving portion 26. Although the amount of light attenuation (i.e., the light absorption level) absorbed in biological tissue or venous blood (i.e.; deoxyhemoglobin Hb) is constant, the amount of light attenuation (i.e., light absorption level) absorbed by the arterial blood (i.e., oxyhemoglobin HbO2) fluctuates based on the person's beat (i.e., pulse) according to the time lapse. Therefore, by using the living body window (i.e., a wavelength region where the light is easy to penetrate the living body), a transition of the absorption level of the peripheral arterial can be measured, and the plethysmogram can be measured.

The measurement principle for a pulse oximeter typically is differential, which means that the pulsation and the oxidization is measured from the difference of the power of the optical signals (e.g., the red light and IR light signals). Alternative measurement techniques can be used in other implementations. For example, additive or a combination of differential and additive signal techniques can be employed.

As indicated above, the measurement principle for pulse oximeter is based on selective control of the wavelengths emitted and received. Various techniques can be used for wavelength selection. In the examples above, the intrinsic wavelength of the light emitting elements (e.g., LEDs) 22, 24 at different material compositions provides the different wavelengths. However, in some implementations, different or additional techniques can be used, such as wavelength control by external stabilization (e.g., Bragg-Reflectors), filtering of the emission from the LEDs by external filters, and filtering of a broad band light source on the emission side or on the receiver side.

Modules 20, 20A, 20B, 20C, 20D and 20E thus can be applied to, or integrated into, various other types of biometric opto-electronic sensor applications, such as a biometric reader or scanner to obtain verification data from a person (e.g., for access control and security applications). For example, in fingerprint biometrics applications, the optical sensor is employed to produce an image of the ridge structure at a fingertip, and this image serves as the basis for further access control activity.

More generally, modules 20, 20A, 20B, 20C, 20D and 20E can be integrated into other types of biometric sensing devices that include any one, or a combination, of the following: a fingerprint scanner, a retinal scanner, a palm scanner, or a body part scanner adapted to scan any given body part. Modules 20, 20A, 20B, 20C, 20D and 20E also can be used in other applications in the medical and health fields, as well as other fields.

Modules 20, 20A, 20B, 20C, 20D and 20E can be advantageous because, in some implementations, the module can be placed in direct contact (or very close contact) with the human body where the measurements are to take place. For example, an index finger (or another body part) of the human patient who is being examined can be placed directly onto the upper exterior surface of the module. Thus, in the implementations of FIGS. 1 and 5, the patient's skin can be in direct contact with cover glass 32. Likewise, in the implementation of FIG. 7, the patient's skin can be pressed onto the surface of optics member 66 such that part of the skin is in contact with light blocking regions 74. Similarly, in the implementation of FIG. 8, the patient's skin can be pressed against the surface of optics member 66 such that part of the skin is in contact with light shaping elements 72. In the implementation of FIG. 9, the patient's skin can be pressed against the upper surface of separation member 30. The foregoing arrangements can facilitate obtaining accurate measurements of physical properties relating to a patient's health by helping couple the light into the desired part of the patient's body and by coupling the reflected light back into the module for detection.

Other implementations are within the scope of the claims.

What is claimed is:

1. An opto-electronic module comprising:
a substrate in which or on which are mounted a plurality of opto-electronic devices; and
a cover over the substrate, wherein the cover includes first regions respectively aligned with the plurality of opto-electronic devices, and wherein the first regions are substantially transparent to a particular one or more wavelengths of light emitted by or sensed by the respective opto-electronic devices, wherein optical axis of adjacent ones of the first regions are separated from one another by a respective second light blocking region embedded in the cover, the second light blocking region being substantially non-transparent to the particular one or more wavelengths and being composed of epoxy containing carbon black.

2. The opto-electronic module of claim 1 wherein the epoxy contains at least 7% carbon black.

3. An opto-electronic module comprising:
a substrate in which or on which are mounted a plurality of opto-electronic devices; and
a cover over the substrate, wherein the cover includes first regions respectively aligned with the plurality of opto-electronic devices, and wherein the first regions are substantially transparent to a particular one or more wavelengths of light emitted by or sensed by the respective opto-electronic devices, wherein optical axis of adjacent ones of the first regions are separated from one another by a respective second light blocking region embedded in the cover, the second region being substantially non-transparent to the particular one or more wavelengths,
wherein the second light blocking region extends through a majority of a thickness of the cover, the second light blocking region extending from a bottom surface of the cover toward a top surface of the cover, but does not reach the top surface.

4. The opto-electronic module of claim 3 wherein the first regions are composed of glass.

5. The opto-electronic module of claim 3 wherein the second light blocking region is composed of a UV- or thermally-curing material.

6. The opto-electronic module of claim 5 wherein the second region has an absorbance at the particular one or more wavelengths of at least three.

7. The opto-electronic module of claim 3 wherein the plurality of opto-electronic devices mounted in or on the substrate include a light emitting element and a light sensing element whose optical axes are separated from one another by a wall of a separation member, the separation member being disposed between the substrate and the cover, and wherein the second light blocking region embedded in the cover is aligned substantially with the wall of the separation member.

8. The opto-electronic module of claim 7 further including an optics member disposed between the cover and the separation member, the optics member including optical elements each of which is aligned with a respective one of the plurality of opto-electronic devices.

9. The opto-electronic module of claim 3 wherein the plurality of opto-electronic devices mounted in or on the substrate include a first light emitting element, a second light emitting element and a light sensing element, wherein optical axes of adjacent ones of the opto-electronic devices are separated from one another by respective partitions that are substantially non-transparent to light at wavelengths emitted by the first and second light emitting elements, and wherein the cover includes a plurality of second light blocking regions, each of which is aligned substantially with one of the partitions.

10. The opto-electronic module of claim 9 wherein the second light blocking regions are composed of an epoxy.

11. The opto-electronic module of claim 9 wherein the second light blocking regions are composed of a UV- or thermally-curing material.

12. The opto-electronic module of claim 9 wherein each of the second light blocking regions and the partitions has an absorbance of at least three for wavelengths emitted by the first and second light emitting elements.

13. The opto-electronic module of claim 12 wherein each of the second light blocking regions extends through a majority of a thickness of the cover from its lower surface to its upper surface.

14. An opto-electronic module comprising:
a substrate in which or on which are mounted a plurality of opto-electronic devices;
an optics member including at least one optical element, each optical element being aligned with a respective one of the plurality of opto-electronic devices; and
a separation member disposed between the substrate and the optics member, the separation member having a partition that separates adjacent ones of the opto-electronic devices from one another,
wherein the optics member includes a light blocking portion that is substantially non-transparent to wavelengths of light emitted by or sensed by the respective opto-electronic devices, wherein the light blocking portion is disposed over the partition of the separation member, and
wherein a convex-shaped light blocking element is disposed on the light blocking portion of the optics member at an exterior surface of the opto-electronic module and projects slightly beyond the exterior surface of the optics member.

15. The opto-electronic module of claim 14 wherein the light blocking element is substantially non-transparent to wavelengths of light emitted by or sensed by the respective opto-electronic devices.

16. The opto-electronic module of claim 14,
wherein the plurality of opto-electronic devices mounted in or on the substrate include a first light emitting element, a second light emitting element and a light sensing element, wherein optical axes of adjacent ones of the opto-electronic devices are separated from one another by respective partitions formed by the separation member, wherein the partitions are substantially non-transparent to light at wavelengths emitted by the first and second light emitting elements,
wherein the optics member includes a plurality of light blocking portions that are substantially non-transparent to wavelengths of light emitted by or sensed by the respective opto-electronic devices, wherein each light blocking portion is disposed over a respective one of the partitions of the separation member, and
wherein a light blocking element is disposed on each of the light blocking portions of the optics member at an exterior surface of the opto-electronic module.

17. The opto-electronic module of claim 14 wherein the light blocking element is embossed on an outer surface of the optics member.

* * * * *